United States Patent [19]

Hellwig

[11] Patent Number: 5,518,549
[45] Date of Patent: May 21, 1996

[54] SUSCEPTOR AND BAFFLE THEREFOR

[75] Inventor: Lance G. Hellwig, Jennings, Mo.

[73] Assignee: MEMC Electronic Materials, Inc., St. Peters, Mo.

[21] Appl. No.: 423,363

[22] Filed: Apr. 18, 1995

[51] Int. Cl.⁶ .................................................... C23C 16/00
[52] U.S. Cl. .......................... 118/728; 118/715; 118/725; 118/730
[58] Field of Search .................................. 118/725, 728, 118/730, 715

[56] References Cited

U.S. PATENT DOCUMENTS

| | | | |
|---|---|---|---|
| 3,623,712 | 11/1971 | McNeilly et al. | 263/41 |
| 4,047,496 | 9/1977 | McNeilly et al. | 118/49.1 |
| 4,081,313 | 3/1978 | McNeilly et al. | 156/610 |
| 4,496,609 | 1/1985 | McNeilly et al. | 427/55 |
| 4,728,389 | 3/1988 | Logar | 156/612 |

OTHER PUBLICATIONS

M. L. Hammond, "Introduction to Chemical Vapor Deposition", Solid State Technology/Dec. 1979, pp. 60–65.

*Primary Examiner*—Richard Bueker
*Attorney, Agent, or Firm*—Senniger, Powers, Leavitt & Roedel

[57] ABSTRACT

A susceptor for holding semiconductor wafers in a barrel reactor for chemical vapor deposition of material on the wafers having a baffle for reducing the amount of material deposited at the bottom of the lowest wafers held in the susceptor. The baffle includes a plate mounted on the bottom of the susceptor and a deflector for each wall of the susceptor. The deflectors each have the shape of a chordal section of a cylinder and are mounted on the plate against a respective wall of the susceptor below the lowest wafer-holding recess on that wall of the susceptor.

22 Claims, 4 Drawing Sheets

SUSCEPTOR AND BAFFLE THEREFOR

BACKGROUND OF THE INVENTION

This invention relates generally to susceptors used in chemical vapor deposition of material on semiconductor wafers, and more particularly to a susceptor having a baffle for use in controlling material deposition thickness.

Chemical vapor deposition is a process by which a stable solid may be formed by decomposition of chemical vapors using heat, plasma, ultraviolet light or other energy sources. Chemical vapor deposition is widely employed in the production of semiconductor wafers to grow epitaxial layers on a surface of the wafers, as well as for the deposition of polysilicon on the wafers. Epitaxy is an important process in the semiconductor material industry for achieving the necessary electrical properties of the semiconductor material. For example, a lightly doped epitaxial layer grown over a heavily doped substrate permits a CMOS device to be optimized for latch up immunity as a result of the low resistance of the substrate. Other advantages, such as precise control of the dopant concentration profile and freedom from oxygen are also achieved.

Epitaxial growth is almost universally carried out by chemical vapor deposition because it is the most flexible and cost efficient method for growing epitaxial layers on semiconductor material. Generally speaking, chemical vapor deposition involves introduction of volatile reactants (e.g., $SiCl_4$, $SiHCl_3$, $SiH_2Cl_2$ or $SiH_4$) with a carrier gas (usually hydrogen) in a reactor. Achieving the desired epitaxial growth on the semiconductor material is also temperature dependent. Depending upon which reactant is used, the temperature in the reactor may be from 950° C. to 1250° C. The environment in which the deposition occurs must be clean with the oxygen content below 1 ppma.

Chemical vapor deposition is carried out in reactors which either pass the reactants and carrier gas generally parallel to the face of the semiconductor wafers (horizontal or cylindrical reactors) or generally perpendicularly to the face of the wafers (vertical reactors). For various reasons understood by those of ordinary skill in the art, cylindrical or barrel reactors are commonly employed in the industry. A barrel reactor has silicon carbide coated, graphite susceptor which is generally in the form of a polygonal tube having walls in which there are generally vertically arranged, circular recesses for receiving semiconductor wafers. The walls of the susceptor are sloped slightly from the vertical to permit the wafers to be retained in the recesses. The reactants and carrier gas are introduced generally at the top of the reactor and flow generally downwardly and then up the opposite side. The vapor flow is made more complex by interaction of the vapor with the walls of the reactor and the rotation of the susceptor in the reactor, but the flow of reactants is always substantially parallel to the faces of the wafers.

One of the primary problems associated with chemical vapor deposition in barrel reactors is maintaining the thickness uniformity of the deposited layer of material on each wafer and between the various wafers held on the susceptor. The most common method of controlling thickness uniformity is the adjustment of vapor flow, although minor changes can be made through temperature adjustments. However, it has been found that these adjustments are not sufficient to obtain thickness uniformity when processing relatively large semiconductor wafers (e.g., 200 mm diameter wafers). More specifically, too much material tends to be deposited at the bottom of large diameter wafers held in the lowest recess on each susceptor wall.

SUMMARY OF THE INVENTION

Among the several objects and features of the present invention is the provision of a susceptor which prevents a build up in the layer thickness at the bottom of a semiconductor wafer in a barrel chemical vapor deposition reactor; the provision of such a susceptor which effects the thickness of the deposited layer only in the area of the wafer in which a build up would otherwise occur; the provision of such a susceptor which can be used in existing reactors; and the provision of such a susceptor which can be economically made, Further among the several objects and features of the present invention may be noted the provision of a baffle capable of being mounted on a susceptor for achieving the objects set forth above.

Other objects and features will be in part apparent and in part pointed out hereinafter.

BRIEF DESCRIPTION OF THE DRAWINGS

Corresponding reference characters indicate corresponding parts throughout the several views of the drawings.

DETAILED DESCRIPTION OF THE PREFERRED EMBODIMENTS

Figure 1:
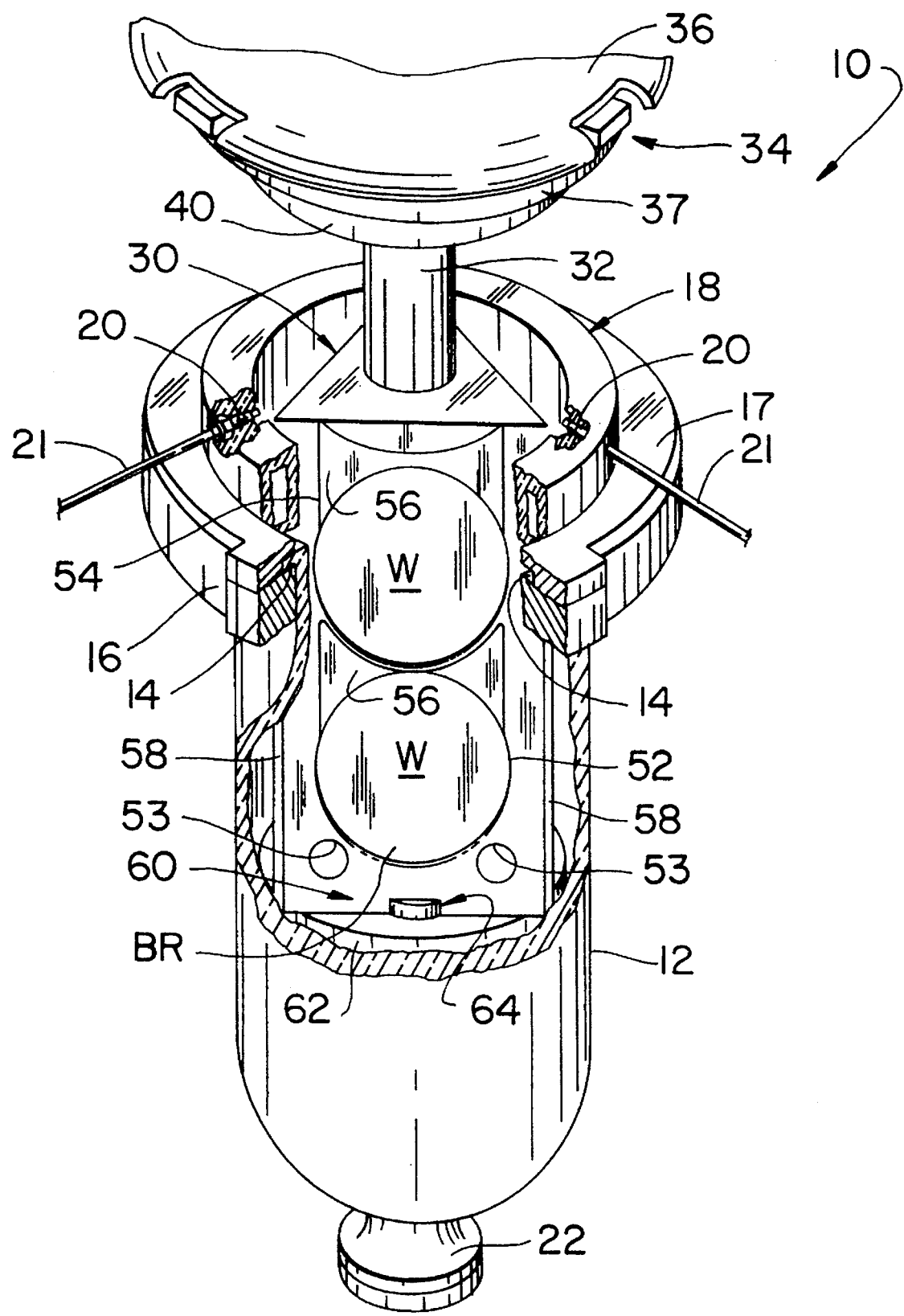
FIG. 1 is a schematic perspective of a barrel reactor with parts broken away to show a susceptor of the present invention.
Figure 2:
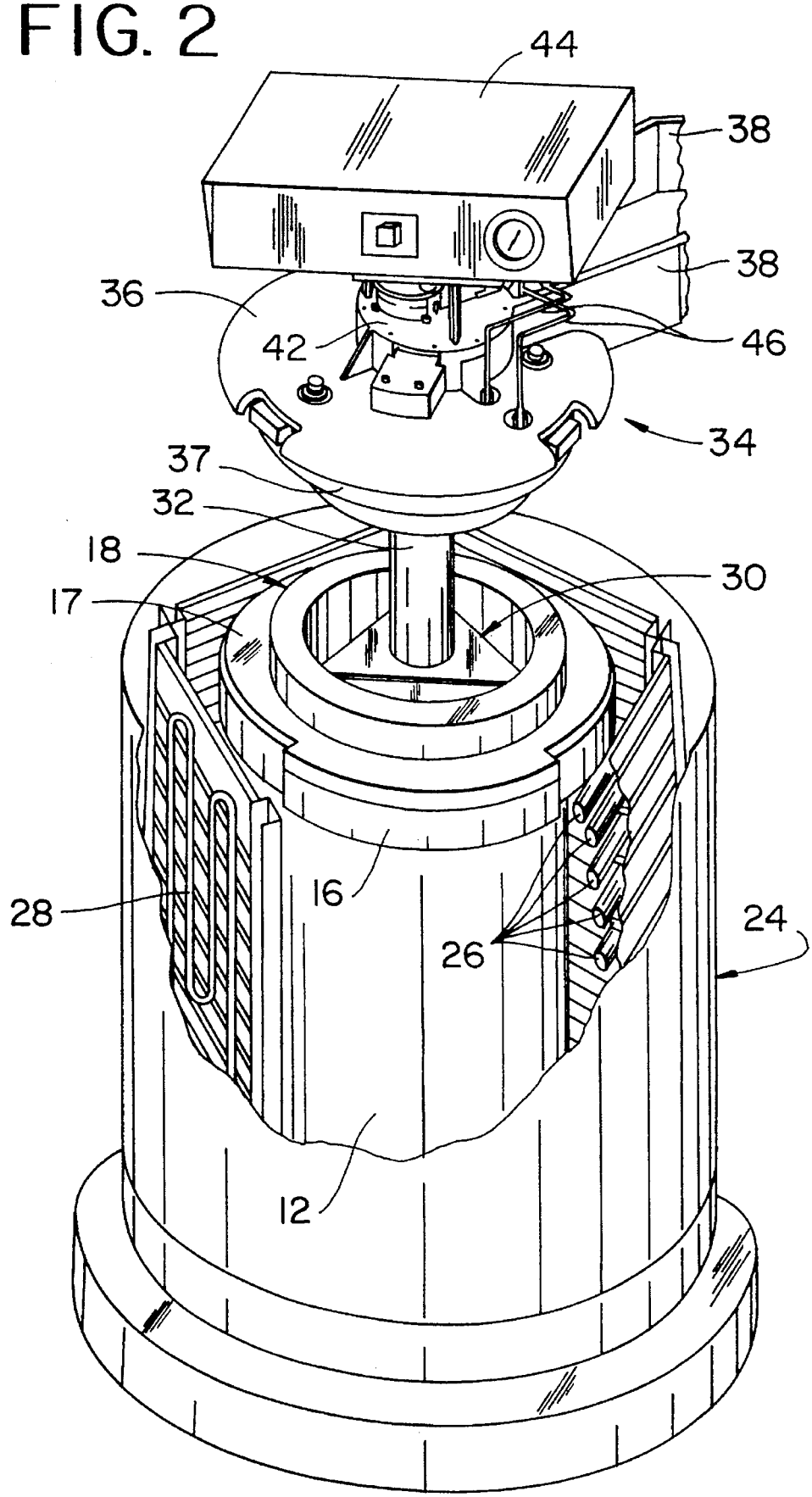
FIG. 2 is a schematic perspective of the barrel reactor illustrating additional elements of the reactor.

Referring now to the drawings and in particular to FIGS. 1 and 2, a barrel reactor, for use in chemical vapor deposition of a layer of material on one face of wafers of semiconductor material, is generally indicated at 10. The barrel reactor includes a quartz bell jar 12 (in an inverted position) having an upper lip 14 which rests on an annular baseplate 16, and is secured between the baseplate and a radially outwardly projecting flange 17 of a gas ring indicated generally at 18. The gas ring at least partially houses two nozzles 20 for introduction of gas, including a reactant which is to be decomposed for deposition on the wafers and a carrier, into the bell jar 12. The gas is delivered through lines 21 to the nozzles 20. The bell jar is formed with an exhaust port 22 in its bottom through which spent gas is exhausted. A housing 24 containing the bell jar 12 also contains radiant heat lamps 26 and heat exchangers 28 for controlling the heat applied to the chamber of the bell jar.

A triangular, silicon-coated graphite susceptor (indicated generally at 30) is hung by a quartz hanger 32 from a lift assembly (indicated generally at 34) capable of lowering the susceptor into the bell jar 12 and raising it out of the bell jar. The lift assembly 34 includes a cap 36 which supports a seal plate 37 sealingly engageable with the gas ring 18 for sealing the bell jar chamber, and lift arms 38 connected to the cap for raising and lowering the cap. A purge baffle 40 depends from the cap 36. A drive assembly 42 for rotating the susceptor 30 about its longitudinal axis, and a control 44 for the drive assembly are located on top of the cap 36. Purge gas lines 46 connected through the cap 36 deliver purge gas generally through the center of the susceptor 30. The construction of the barrel reactor 10, with the exception of the susceptor 30 as described more fully hereinafter, is well known to the semiconductor material producing industry. Accordingly, only a general description of its features and operation are given herein.

Figure 3:
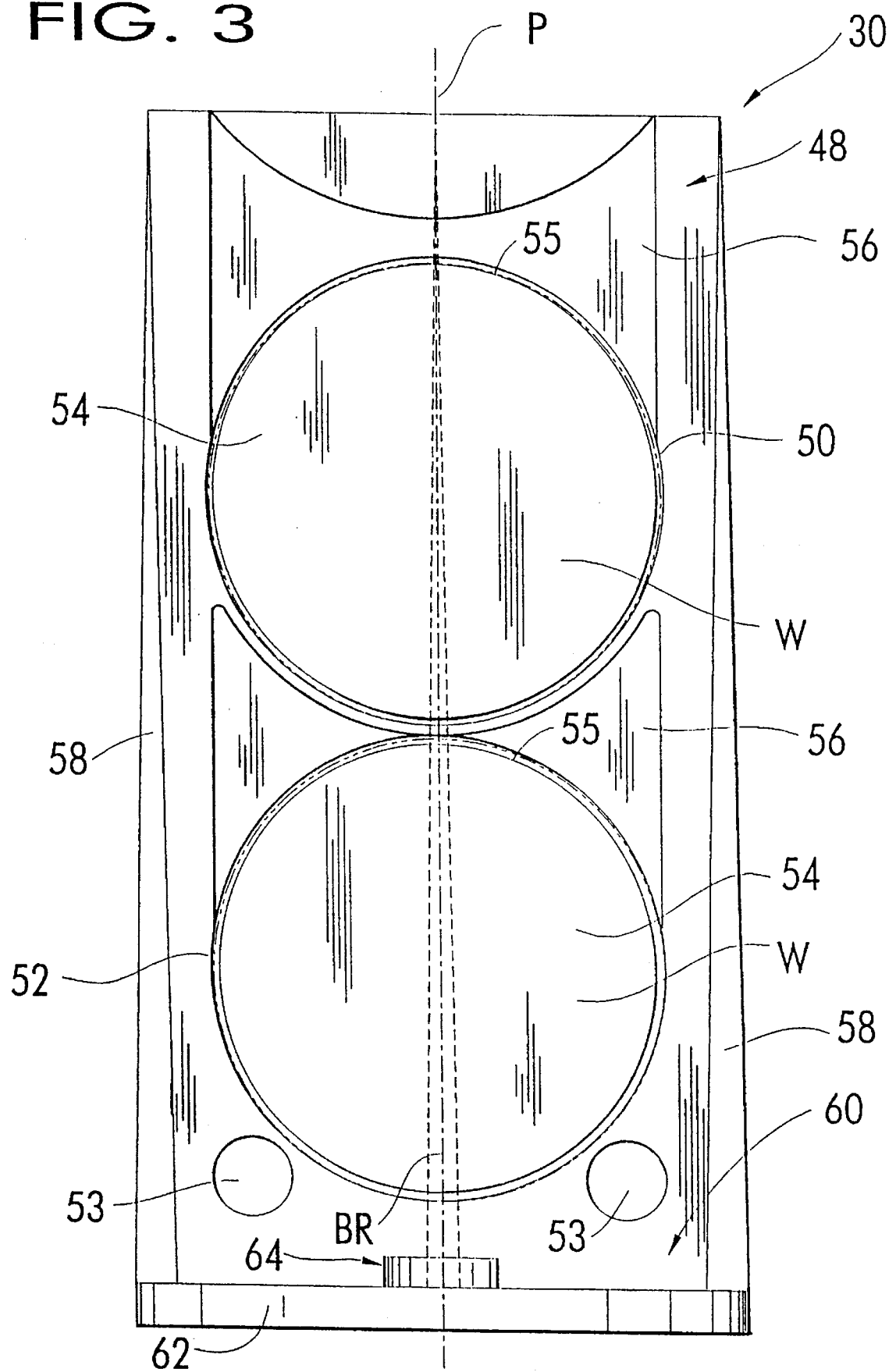
FIG. 3 is an elevation of the susceptor showing semiconductor wafers held in the susceptor in phantom.
Figure 4:
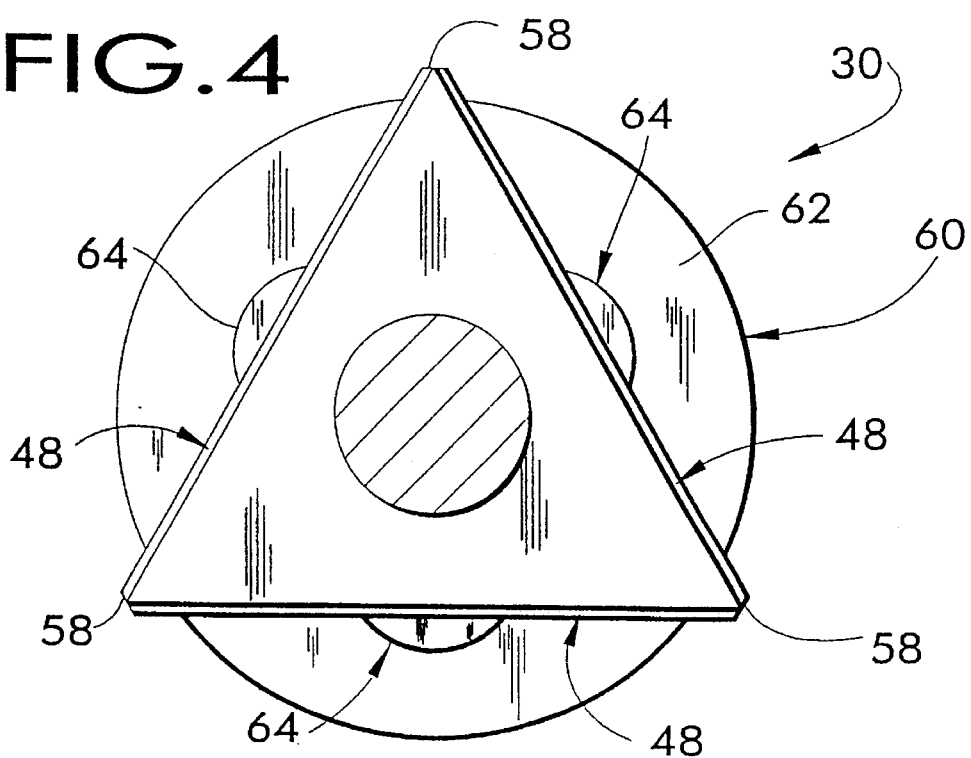
FIG. 4 is a top plan of the susceptor.

Referring now to FIGS. 3 and 4, the susceptor 30 is shown to comprise three walls indicated generally at 48, which are arranged in a triangular (broadly, "polygonal") formation. Each wall 48 has an upper recess 50 and a lower recess 52 which are sized for receiving a semiconductor wafer W of a corresponding size. Test wafer recesses 53 are located near the bottom of the susceptor 30. It is to be understood that each wall 48 may have only a single recess, or more than two and still fall within the scope of the present invention. The walls are arranged substantially vertically, but with a slight inward slope from the bottom to the top of the susceptor which causes the wafers to lean against the walls and to be retained in the recesses.

The wafers shown in FIG. 3 have been shown in phantom to reveal that the recesses 50, 52 each include a generally circular portion 54 sized slightly larger than the wafer W held therein. An annular moat 55 extending around the outer periphery of the circular portion 54. A generally bow tie shaped portion 56 of each recess extends along the upper edge of the circular portion 54 on the opposite side of the moat 55. The circular portion 54 and bow tie portion 56 are cut into the wall of the susceptor 30 approximately the same, substantially constant depth. The moat 55 is cut slightly deeper than the circular portion 54 and bow tie portion 55.

As may be seen in FIG. 3, the height of the bow tie shaped portion 56 of the lower recess 50 tapers to zero in the middle. The height of the bow tie shaped portion of the upper recess 52 also tapers toward the middle, but does not go to zero. The bow tie portion 56 of the upper recess 50 does not taper to zero height in the middle. The bow tie shaped portions 56 facilitate flow of reactant gas to the upper portions of the wafers W, particularly to locations along the upper edge margins of the wafer, just to the left and right of a vertical plane P passing through the centerline of the wafer. The corners of the susceptor 30 between adjacent walls 48 have been cut back in vertical planes leaving flat, laterally outwardly facing surfaces 58. The surfaces 58 permit the susceptor 30 to fit into the bell jar 12 and also facilitate gas flow around the susceptor 30.

Figure 5:
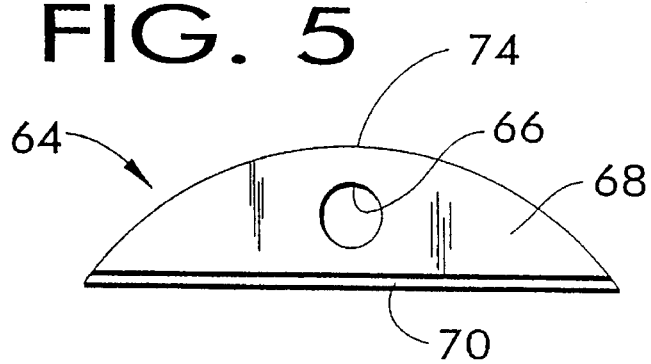
FIG. 5 is a bottom plan of a deflector forming part of a baffle on the susceptor.
Figure 6:
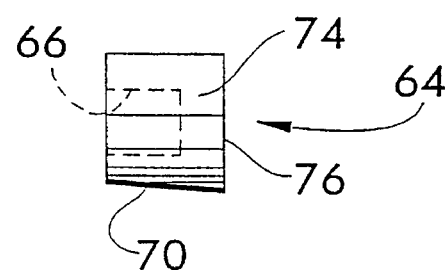
FIG. 6 is a right side elevation of the deflector.
Figure 7:
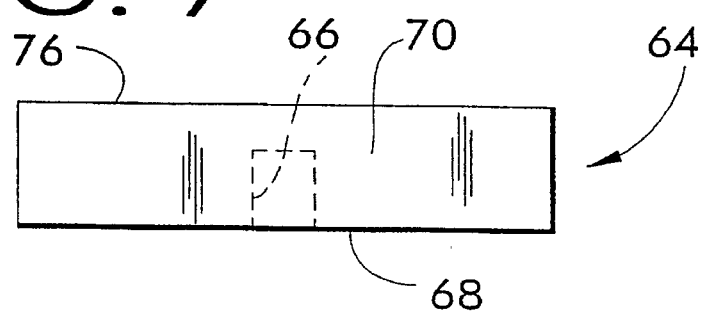
FIG. 7 is a rear elevation of the deflector.

A baffle, generally indicated at 60, includes a generally circular plate 62 mounted on the bottom of the susceptor 30 and projecting outwardly from each wall 48 below the lower recess 52 of each wall. Although the plate 62 is unitary in construction, several separate baffle members, each projecting out from a corresponding wall, could be used without departing from the scope of the present invention. Three substantially identical deflectors, one for each wall, are each designated generally at 64. The deflectors 64 are each mounted on the plate 62 with a suitable fastener such as a bolt (not shown) received in a bore 66 in bottom surface 68 of the deflector. Each deflector 64 abuts its corresponding wall 48 beneath the lower recess 52. A representative deflector 64 illustrated in FIGS. 5–7 of the drawings has the general shape of a chordal section of a cylinder. However, a back surface 70 of the deflector 64 has a slope complementary to that of the wall 48 so that the back surface engages the wall substantially over its entire area.

The deflector 64 is disposed relative to the lower recess 52 so that the deflector is symmetrical about a respective plane P perpendicular to the plate 62 and corresponding wall 48, and passing through the center of the lower recess of that wall (FIG. 4). The plane P is seen edge on in FIG. 4. An upper surface 76 of the deflector 64 is positioned a distance below the bottom of the lower recess 52 corresponding to the thickness of material to be deposited on the bottom region BR of the semiconductor wafer W in the lower recess. Although the baffle 60 is described herein as part of the susceptor 30, it is to be understood that the plate 62 and deflector 64 could be separately made and retrofitted to existing susceptors. Moreover, the use of either the deflector 64 or the plate 62 independently of the other, is considered to be within the scope of the present invention.

Having described the construction of the susceptor 30 of the present invention, the operation will be briefly described in the context of a particular application. It has been found that deposition of epitaxial layers on semiconductor wafers of 200 mm diameter in a barrel reactor such as the barrel reactor 10 described herein, but having a conventional susceptor, is not sufficiently uniform in thickness to remain within the specification of the product for some applications. More particularly, it has been found that the deposited material from the reactant gas tends to build up on the bottom of the wafer in the lower recess. Efforts to reduce thickness at this location by normal control methods are either ineffective or produce adverse consequences at other sites on the wafer face.

Although the flow of gas injected into the chamber of the bell jar 12 is complex, it is generally understood that the streams of gas emitted from the nozzles 20 collide, travel down the back side (as seen from the vantage of FIG. 1) of the bell jar wall and then up the front side. Eventually, the gas exits through the exhaust port 22 in the bottom of the bell jar 12. It is believed that the gas tends to reside a majority of the time near the bottom of the bell jar 12, producing the undesirably increased thickness at the bottom of the wafers in the lowest recesses in the susceptor.

The baffle 60 tends to deflect the flow of gas generally away from the bottom region BR of the wafers W in the lower recesses. The shape of the deflector 64 helps to focus the effect of the deflector precisely at the location where it is needed, i.e., at the bottom region BR of the wafer W in the lower recess 52. A front surface 74 of the deflector 64 curves toward its adjacent wall 48 laterally outwardly from the plane P, so that the amount of gas deflected away from the wafer W decreases away from the bottom region BR of the wafer. However, it is to be understood that the deflector may have shapes other than a chordal section of a cylinder and still fall within the scope of the present invention. Moreover, these other shapes may be such that there is no inward taper laterally outward from the bottom region BR of the wafer without departing from the present invention.

The presence of the plate 62 and deflector 64 has an effect on the temperatures seen by the wafer in the lower recess 52. Temperature effects caused by the baffle 60 near the bottom region BR of the wafer W may also cause changes in the amount of material deposited in that region. The deflector 64 should preferably not be placed too close to the bottom of the lower recess 52. In the example described herein for wafers 200 mm in diameter, it has been found that a spacing of an upper surface 76 of each deflector 64 from the bottom of the lower recess 52 is preferably maintained at about 0.75 inch. A closer location of the deflector 64 to its corresponding lower recess 52 may produce slip in the deposited layer of material on the wafer W.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A susceptor for supporting semiconductor wafers in a barrel reactor for chemical vapor deposition of material on the wafers, the susceptor comprising walls arranged in a generally polygonal formation, a lower recess in each wall located generally adjacent to the bottom of the wall, baffle means located below the lower recess of each wall for diverting some of the vapor flowing in the barrel reactor away from a bottom region of the lower recess and a bottom portion of the semiconductor wafer disposed in the lower recess thereby to retard deposition of material near the bottom of the semiconductor wafer.

2. A susceptor as set forth in claim 1 wherein said baffle means extends outwardly from each wall of the susceptor below the lower recess.

3. A susceptor as set forth in claim 2 wherein said baffle means comprises a plate mounted on the bottom of the susceptor and extending outwardly from each wall of the susceptor.

4. A susceptor as set forth in claim 3 wherein the plate is generally circular.

5. A susceptor as set forth in claim 3 wherein said baffle means further comprises a deflector for each wall, the deflector being located generally between the plate and the lower recess.

6. A susceptor as set forth in claim 5 wherein each deflector is symmetrical about a respective plane perpendicular to the plate and the corresponding wall, and passing through the center of the lower recess in said wall.

7. A susceptor as set forth in claim 6 wherein each deflector has the general shape of a chordal section of a cylinder.

8. A susceptor as set forth in claim 7 wherein each deflector is mounted on the plate and has a surface in face to face engagement with the corresponding wall, the surface having a slope complementary to the slope of the wall.

9. A susceptor as set forth in claim 7 wherein each deflector is spaced downwardly from the bottom of the lower recess on the corresponding wall a distance corresponding to the thickness of material to be deposited on the bottom region of the semiconductor wafer in the lower recess.

10. A susceptor as set forth in claim 1 wherein said baffle means comprises a deflector for each wall, the deflector being located below the lower recess.

11. A susceptor as set forth in claim 10 wherein each deflector is symmetrical about a respective plane perpendicular to the plate and the corresponding wall and passing through the center of the lower recess in said wall.

12. A susceptor as set forth in claim 11 wherein each deflector has the general shape of a chordal section of a cylinder.

13. A susceptor as set forth in claim 12 wherein each deflector has a surface in face to face engagement with the corresponding wall, the surface having a slope complementary to the slope of the wall.

14. A susceptor as set forth in claim 12 wherein each deflector is spaced downwardly from the bottom of the lower recess on the corresponding wall a distance corresponding to the thickness of material to be deposited on the bottom region of the semiconductor wafer in the lower recess.

15. A susceptor as set forth in claim 1 wherein the lower recess of each wall includes a generally circular portion generally corresponding to the size of the semiconductor wafer to be held therein, and another portion extending generally along an upper edge of the circular portion.

16. A susceptor as set forth in claim 15 wherein said another portion is disposed on both sides of a plane extending longitudinally of the susceptor and passing through the center point of the circular portion.

17. A susceptor as set forth in claim 16 wherein the height dimension of said another portion increases laterally outwardly from the longitudinal plane.

18. A baffle for use on a susceptor constructed for holding semiconductor wafers in a barrel reactor for chemical vapor deposition of material on the wafers, the baffle comprising deflectors and means for mounting the deflectors on the susceptor, the deflectors being shaped for deflecting at least some of the flow of vapor in the barrel reactor away from a bottom region of a wafer to limit deposition of material on the bottom region of the wafer.

19. A baffle as set forth in claim 18 wherein each deflector has the general shape of a chordal section of a cylinder.

20. A baffle as set forth in claim 19 wherein each deflector has a sloped surface adapted for face to face engagement with a wall of the susceptor.

21. A baffle as set forth in claim 20 further comprising a plate constructed for mounting on the bottom of the susceptor with portions of the plate projecting laterally outwardly from the susceptor, the plate being adapted to mount the deflectors on the susceptor.

22. A baffle as set forth in claim 18 further comprising a plate constructed for mounting on the bottom of the susceptor with portions of the plate projecting laterally outwardly from the susceptor, the plate being adapted to mount the deflectors on the susceptor.

* * * * *

UNITED STATES PATENT AND TRADEMARK OFFICE
CERTIFICATE OF CORRECTION

PATENT NO. : 5,518,549

DATED : May 21, 1996

INVENTOR(S) : Lance G. Hellwig

It is certified that error appears in the above-identified patent and that said Letters Patent is hereby corrected as shown below:

Column 6, claim 21, line 41, "claim 20 further comprising a" should read ---claim 20 wherein said baffle mounting means comprises a---.

Column 6, claim 22, line 46, "claim 18 further comprising a" should read ---claim 18 wherein said baffle mounting means comprises a---.

Signed and Sealed this

Twenty-first Day of January, 1997

Attest:

BRUCE LEHMAN

*Attesting Officer*     *Commissioner of Patents and Trademarks*